US008071425B2

(12) United States Patent
Nakatani et al.

(10) Patent No.: US 8,071,425 B2
(45) Date of Patent: Dec. 6, 2011

(54) FLIP CHIP MOUNTING BODY, FLIP CHIP MOUNTING METHOD AND FLIP CHIP MOUNTING APPARATUS

(75) Inventors: Seiichi Nakatani, Osaka (JP); Takashi Kitae, Osaka (JP); Yoshihisa Yamashita, Kyoto (JP); Takashi Ichiryu, Osaka (JP); Seiji Karashima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/764,455

(22) Filed: Apr. 21, 2010

(65) Prior Publication Data

US 2010/0203675 A1 Aug. 12, 2010

Related U.S. Application Data

(62) Division of application No. 11/909,856, filed as application No. PCT/JP2006/305004 on Mar. 14, 2006, now Pat. No. 7,732,920.

(30) Foreign Application Priority Data

Mar. 28, 2005 (JP) ................................ 2005-090888

(51) Int. Cl.
*H01L 21/52* (2006.01)

(52) U.S. Cl. ................ 438/108; 257/E21.511; 438/118

(58) Field of Classification Search .................. 438/108, 438/118, E21.511
See application file for complete search history.

(56) References Cited

U.S. PATENT DOCUMENTS 5,145,532 A 9/1992 Fukunaga et al.
5,986,885 A 11/1999 Wyland
6,566,612 B2 * 5/2003 Brouillette et al. ........... 174/263

(Continued)

FOREIGN PATENT DOCUMENTS

JP 59-129447 A 7/1984

(Continued)

OTHER PUBLICATIONS

Sakamoto, I. et al., "Ultra fine pitch solder bump forming equipment compatible with lead-free solder", Electronics Packing Technology, vol. 30, No. 12, 2004, pp. 34-35.

*Primary Examiner* — Allan R Wilson
(74) *Attorney, Agent, or Firm* — Hamre, Schumann, Mueller & Larson, P.C.

(57) ABSTRACT

The flip chip mounted body of the present invention includes: a circuit board (213) having a plurality of connection terminals (211); a semiconductor chip (206) having a plurality of electrode terminals (207) that are disposed opposing the connection terminals (211); and a porous sheet (205) having a box shape that is provided on an opposite side of a formation surface of the electrode terminal (207) of the semiconductor chip (206), is folded on an outer periphery of the semiconductor chip (206) on the formation surface side of the electrode terminal (207) and is in contact with the circuit board (213), wherein the connection terminal (211) of the circuit board (213) and the electrode terminal (207) of the semiconductor chip (206) are connected electrically via a solder layer (215), and the circuit board (213) and the semiconductor chip (206) are fixed by a resin (217). Thereby, the flip chip mounted body with excellent productivity and reliability that can mount the semiconductor chip on the circuit board, and a method and an apparatus for mounting the flip chip mounted body are provided.

11 Claims, 6 Drawing Sheets

U.S. PATENT DOCUMENTS 6,566,748 B1 5/2003 Shimizu et al.
2002/0185309 A1 12/2002 Imamura et al.
2003/0015342 A1* 1/2003 Sakamoto et al. ............ 174/250
2004/0061207 A1 4/2004 Ding
2004/0168825 A1* 9/2004 Sakamoto et al. ............ 174/260
2005/0104164 A1 5/2005 Awujoola et al.
2005/0253254 A1 11/2005 Neogi et al.
2007/0001313 A1 1/2007 Fujimoto et al.
2008/0151520 A1* 6/2008 Sakamoto et al. ............ 361/764
2009/0023245 A1* 1/2009 Kitae et al. .................... 438/108
2009/0057928 A1* 3/2009 Zhai et al. ..................... 257/789
2009/0212420 A1* 8/2009 Hedler et al. ................. 257/737
2010/0031503 A1* 2/2010 Sakamoto et al. .............. 29/852

FOREIGN PATENT DOCUMENTS

JP 1-157796 6/1989
JP 11-040704 2/1999
JP 2000-094179 4/2000
JP 2000-307033 11/2000
JP 2000-332055 11/2000
JP 2002-329745 11/2002
JP 2003-258413 9/2003
JP 2004-257206 9/2004
JP 2004-260131 9/2004

* cited by examiner

FLIP CHIP MOUNTING BODY, FLIP CHIP MOUNTING METHOD AND FLIP CHIP MOUNTING APPARATUS

This application is a division of U.S. Ser. No. 11/909,856, filed Sep. 27, 2007, which is a U.S. National Stage of PCT/JP2006/305004, filed Mar. 14, 2006, which applications are incorporated herein by reference.

TECHNICAL FIELD

The present invention relates to a flip chip mounting method for mounting a semiconductor chip on a circuit board. In particular, the present invention relates to a flip chip mounted body that is adaptable to a semiconductor chip with a narrower pitch and has high productivity and excellent reliability of connection, a method for mounting the same, and a flip chip mounted apparatus.

BACKGROUND ART

In recent years, with a trend toward a higher density and a higher degree of integration for a semiconductor integrated circuit (hereinafter, abbreviated as a "semiconductor") chip used for electronic equipment, the number of pins of electrode terminals of a semiconductor chip has been increased and the pitch thereof has been decreased rapidly. For mounting these semiconductor chips on circuit boards, flip chip mounting is used widely in order to decrease a wiring delay.

In this flip chip mounting, solder bumps generally are formed on electrode terminals of the semiconductor chip, which then are joined to connection terminals formed on the circuit board with these solder bumps at one time.

However, in order to mount a next-generation semiconductor chip having more than 5,000 electrode terminals on a circuit board, it is necessary to form solder bumps that correspond to a narrow pitch of 100 μm or less, but it is difficult to adapt to it with a current technique for forming solder bumps.

Moreover, since it is necessary to form a large number of solder bumps that correspond to the number of the electrode terminals, the productivity has to be raised by shortening a mounting cycle for each chip, in order to achieve a cost reduction.

Similarly, in the semiconductor chip, the increase in the number of the electrode terminals has brought about a transition from peripheral-disposed electrode terminals to area-disposed electrode terminals.

Moreover, due to the demands for a higher density and a higher degree of integration, a semiconductor process is expected to develop from 90 nm to 65 nm and further to 45 nm. As a result, the wiring becomes even finer, and the formation of the solder bumps on the area-disposed electrode terminals and the flip chip mounting of the semiconductor chip become difficult.

Thus, there is a demand for a flip chip mounting method that is adaptable to a decrease in thickness and an increase in density due to the future development of the semiconductor process.

Conventionally, as a technique for forming solder bumps, plating, screen printing and the like have been developed. The plating is suitable for a narrow pitch, but has a problem in productivity due to its complicated processes. On the other hand, the screen printing has excellent productivity, but is not suitable for narrowing a pitch because of the use of a mask.

In the light of the problems described above, several techniques for forming solder bumps selectively on electrode terminals of a semiconductor chip or a circuit board have been developed recently. These techniques not only are suitable for forming fine solder bumps but also have excellent productivity because they can form the solder bumps all at one time, and attract attention as techniques that are adaptable to the mounting of the next-generation semiconductor chip on the circuit board.

One of these techniques is called a solder paste method. In this technique, a solder paste, which is a mixture of solder particles and flux, is applied solidly onto a circuit board whose surface is provided with electrode terminals, and the circuit board is heated so as to melt the solder particles, whereby solder bumps are formed selectively on the electrode terminals that have a high wettability (see Patent document 1, for example).

Moreover, in a technique called a super solder method, a paste-like composition (chemical reaction deposition-type solder) that contains an organic acid lead salt and metal tin as main components is applied solidly onto a circuit board on which electrode terminals are formed, and the circuit board is heated so as to cause a substitution reaction between Pb and Sn, thereby depositing a Pb/Sn alloy selectively on the electrode terminals of the board (see Patent document 2, for example).

A conventional flip chip mounting further requires a process of injecting a resin called an underfill between the semiconductor chip and the circuit board in order to fix the semiconductor chip on the circuit board, after mounting the semiconductor chip on the circuit board on which solder bumps are formed. Thereby, there also have been problems of an increase of the number of steps and an decrease of a yield.

Then, as a method for establishing an electric connection between opposed electrode terminals of the semiconductor chip and the circuit board and fixing the semiconductor chip onto the circuit board both at the same time, a flip chip mounting technique using an anisotropic electrically conductive material has been developed. In this technique, by supplying a thermosetting resin containing electrically conductive particles between the circuit board and the semiconductor chip, and then heating the thermosetting resin while applying pressure to the semiconductor chip at the same time, it is possible to establish the electric connection between the electrode terminals of the semiconductor chip and the circuit board and fix the semiconductor chip to the circuit board at the same time (for example, see Patent document 3).

However, in both of the solder paste method described in Patent document 1 and the super solder method described in Patent document 2, since the paste-like composition simply is supplied onto the circuit board by application, local variations in thickness and concentration occur, resulting in variations in the solder deposition amount for individual electrode terminals. Consequently, it is not possible to achieve solder bumps with uniform heights. Also, in these methods, since the paste-like composition is supplied by application onto the circuit board whose surface is provided with the electrode terminals, namely, with projections or depressions, a sufficient amount of solder cannot be supplied onto the electrode terminals serving as the projections, making it difficult to achieve a desired solder bump height necessary for the flip chip mounting.

Moreover, in the flip chip mounting method described in Patent document 3, there are many problems in productivity and reliability that are to be solved as described below.

Firstly, since the electric conduction between the electrode terminals is obtained by mechanical contact via the electrically conductive particles, it is difficult to achieve a stable conductive state. Secondarily, since a distance varies depending on an amount of the electrically conductive particles that are present between the electrode terminals of the semiconductor chip and the circuit board, the electric connection is unstable. Thirdly, in the heating process for curing the thermosetting resin, the electrically conductive particles are scattered, which causes a decrease of a yield due to a short circuit generated thereby. Fourthly, because of a structure where a connection part between the semiconductor chip and the circuit board is exposed and sinks into moisture or the like, and a life span and reliability of the circuit board deteriorate.

Patent document 1: JP 2000-94179 A

Patent document 2: JP1 (1989)-157796 A

Patent document 3: JP2000-332055 A

DISCLOSURE OF INVENTION

In order to solve the above-described problems, it is an object of the present invention to provide a flip chip mounted body with excellent productivity and reliability, which can mount a next-generation semiconductor chip having more than 5,000 electrode terminals on a circuit board, a flip chip mounting method and a flip chip mounted apparatus.

A flip chip mounted body of the present invention includes: a circuit board having a plurality of connection terminals; a semiconductor chip having a plurality of electrode terminals that are disposed opposing the connection terminals; and a porous sheet having a box shape that is provided on an opposite side of a formation surface of the electrode terminal of the semiconductor chip, is folded on an outer periphery of the semiconductor chip on the formation surface side of the electrode terminal and is in contact with the circuit board, wherein the connection terminal of the circuit board and the electrode terminal of the semiconductor chip are connected electrically via a solder layer, and the circuit board and the semiconductor chip are fixed by a resin.

A flip chip mounting method of the present invention is a flip chip mounting method for disposing a semiconductor chip having a plurality of electrode terminals so as to oppose a circuit board having a plurality of connection terminals and connecting the connection terminal of the circuit board and the electrode terminal of the semiconductor chip electrically, the flip chip mounting method including: adhering the semiconductor chip to a porous sheet and subsequently deforming a periphery of the semiconductor chip; applying a solder resin composition that contains solder particles, a convection additive and a resin as main components onto the circuit board or the semiconductor chip; positioning so as to dispose the porous sheet on the circuit board; heating the solder resin composition to a temperature at which the solder particles are melted so as to generate gas by boiling or decomposition of the convection additive; and connecting the connection terminal and the electrode terminal electrically by allowing the melted solder particles to flow in the resin composition so as to self-assemble and grow the solder particles before the gas is released, passes through the porous sheet and is scattered.

Another flip chip mounting method of the present invention is a flip chip mounting method for disposing a semiconductor chip having a plurality of electrode terminals so as oppose a circuit board having a plurality of connection terminals and connecting the connection terminal of the circuit board and the electrode terminal of the semiconductor chip electrically, the flip chip mounting method including: deforming a porous sheet so as to have a box shape covering the semiconductor chip; adhering the semiconductor chip to an inside bottom part of the porous sheet having a box shape; applying a solder resin composition that contains solder particles, a convection additive and a resin as main components onto the circuit board or the semiconductor chip; positioning so as to dispose the porous sheet on the circuit board; heating the resin composition to a temperature at which the solder particles are melted so as to generate gas by boiling or decomposition of the convection additive; and connecting the connection terminal and the electrode terminal electrically by allowing the melted solder particles to flow in the resin composition so as to self-assemble and grow the solder particles before the gas is released, passes through the porous sheet and is scattered.

Still another flip chip mounting method of the present invention is a flip chip mounting method for disposing a semiconductor chip having a plurality of electrode terminals so as to oppose a circuit board having a plurality of connection terminals and connecting the connection terminal of the circuit board and the electrode terminal of the semiconductor chip electrically, the flip chip mounting method including: adhering the semiconductor chip to a porous sheet; applying a solder resin composition that contains solder particles, a convection additive and a resin as main components to the board or the semiconductor chip; positioning so as to dispose the porous sheet on the circuit board; deforming the porous sheet; heating the resin composition to a temperature at which the solder particles are melted so as to generate gas by boiling or decomposition of the convection additive; and connecting the connection terminal and the electrode terminal electrically by allowing the melted solder particles to flow in the resin composition so as to self-assemble and grow the solder particles before the gas is released, passes through the porous sheet and is scattered.

Still another flip chip mounting method of the present invention is a flip chip mounting method for disposing a semiconductor chip having a plurality of electrode terminals so as to oppose a circuit board having a plurality of connection terminals and connecting the connection terminal of the circuit board and the electrode terminal of the semiconductor chip electrically, the flip chip mounting method including; applying a solder resin composition that contains solder particles, a convection additive and a resin as main components to the circuit board or the semiconductor chip; positioning so as to dispose the semiconductor chip on the circuit board; applying an adhesive to the semiconductor chip so as to adhere the porous sheet to the semiconductor chip; deforming the porous sheet; heating the resin composition to a temperature at which the solder particles are melted so as to generate gas by boiling or decomposition of the convection additive; and connecting the connection terminal and the electrode terminal electrically by allowing the melted solder particles to flow in the resin composition so as to self-assemble and grow the melted solder particles before the gas is released, passes through the porous sheet and is scattered.

A flip chip mounted apparatus of the present invention is a flip chip mounting apparatus for flip-chip-mounting a semiconductor chip on a circuit board, the flip chip mounting apparatus including: a fixing member that fixes the semiconductor chip to a porous sheet; a deforming member for deforming a periphery of the porous sheet along a circumference of the semiconductor chip; an applying member for applying a solder resin composition that contains solder particles, a convection additive and a resin as main components onto the circuit board or the semiconductor chip; a positioning member for positioning the semiconductor chip by holding the porous sheet on the circuit board; and a heating member for melting the solder particles of the resin composition.

DESCRIPTION OF THE INVENTION

Figure 1A:
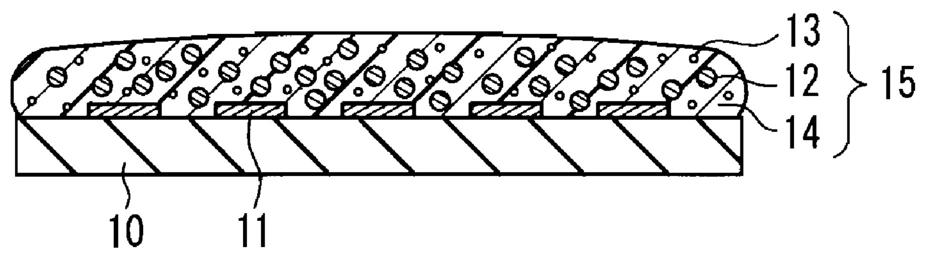
FIGS. 1A to 1C are cross-sectional views showing a basic process mechanism of a flip chip mounting method according to one example of the present invention.

In the mounted body of the present invention, a connection terminal of a circuit board and an electrode terminal of a semiconductor chip are electrically connected via a solder layer. This solder layer is formed on a solder connection body by assembly of solder particles. This solder layer is formed by heating a solder resin paste containing the solder particles, a resin and a convection additive so as to boil the convection additive and cause convection of the resin, assembling the solder particles, and connecting the connection terminal and the electrode terminal. That is, by the heating, the convection additive in the paste state is boiled, and the solder particles are assembled according to this boiling. If the solder particles also are melted at this time, the solder particles are self-assembled to the connection terminal and the electrode terminal that have high wettability, and can be formed into the solder layer. On an opposite side of a formation surface of the electrode terminal of the semiconductor chip, a porous sheet having a box shape that is folded on the formation surface side of the electrode terminal on an outer periphery of the semiconductor chip, and is in contact with the circuit board is provided. This porous sheet allows the gasified convection additive to escape toward the outside when forming the solder layer by assembling the solder particles between the connection terminal of the circuit board and the electrode terminal of the semiconductor chip, and thus is used for maintaining a gap between the connection terminal of the circuit board and the semiconductor chip, and the positions thereof.

The porous sheet may have a box shape that covers the semiconductor chip and has a brim whose peripheral edge protrudes near its opening.

Further, the porous sheet may have a hole that connects a front side and a rear side.

Further, the porous sheet may be made of a material that has air permeability such as a thermoplastic resin, a thermosetting resin, a nonwoven fabric or a foam metal.

Further, the hole of the porous sheet may be closed by a resin.

Further, a part around the porous sheet that is in contact with the circuit board may be contacted with a resin.

According to such a configuration, the flip chip mounted body that has excellent reliability of the connection or the like and a mechanical strength can be achieved.

In the method of the present invention, a process for deforming the porous sheet may include heating.

Further, in the process for deforming a periphery of the porous sheet, the porous sheet may be processed so as to cover the semiconductor chip and have a box shape, and a peripheral edge of an opening of the porous sheet having the box shape is in contact with the circuit board, so that the semiconductor chip and the circuit board may be disposed at a predetermined interval.

Further, the porous sheet may have a box shape that covers the semiconductor chip and has the brim whose peripheral edge protrudes near the opening thereof.

According to these methods, since the interval between the electrode terminal of the semiconductor chip and the connection terminal of the circuit board may be maintained to have an appropriate distance, a disconnection and a high resistance connection are not likely to occur because of the uniform connection between the electrode terminal and the connection terminal, thereby improving a yield.

Further, the porous sheet may have a hole that connects a front side and a rear side.

Further, the porous sheet may be made of a material that has air permeability such as a thermoplastic resin, a thermosetting resin, a nonwoven fabric or a foam metal.

Further, the resin contained in the resin composition may penetrate the porous sheet by the heating of the circuit board, close the hole in the porous sheet, and be cured after completion of the heating of the circuit board, so that moisture permeability may be decreased or inhibited.

Further, the part around the porous sheet that is in contact with the circuit board may be contacted with the resin contained in the resin composition.

According to these methods, deterioration of the semiconductor chip caused by moisture and water can be reduced, so that the reliability and the life span can be improved. Further, since the connection of the semiconductor chip can be secured, the circuit board that has excellent vibration resistance and shock resistance can be achieved.

Further, an electrode may be provided so as to surround the connection terminal of the circuit board.

Further, the electrode that is provided so as to surround the connection terminal of the circuit board may be formed to be positioned inside the porous sheet that has the box shape, and a dummy bump may be formed by the process of heating the circuit board.

Further, the electrode on which the dummy bump is formed by the heating process may prevent passing of the solder particles in the resin composition that is applied between the circuit board and the semiconductor chip, and may allow the resin to pass through.

According to these methods, the solder particles in the resin composition that is applied between the circuit board and the semiconductor chip are prevented from scattering and flowing out to the outside by the electrode on which the dummy bump is formed. And, by preventing the contact, the short circuit and the like with the adjacent semiconductor chip by the scattered solder particles, the reliability and the yield can be improved.

Moreover, since the solder particles are self-assembled to the electrode on which the dummy bump is formed, the passing of the solder particles between the electrodes is limited. On the other hand, passing of the resin is possible. Thus, an appropriate amount of the resin in the resin composition flows out from the electrode on which the dummy bump is formed, and sinks between a circumference edge of the porous sheet and the circuit board, so that the outflow stops. As a result, the porous sheet and the circuit board can be fixed reliably by the resin that has been sunk.

Moreover, the flip chip mounted apparatus of the present invention is a flip chip mounting apparatus for flip-chip-mounting a semiconductor chip on a circuit board, the flip chip mounting apparatus including: a fixing member that fixes the semiconductor chip to a porous sheet; a deforming member for deforming a periphery of the porous sheet along a circumference of the semiconductor chip; an applying member for applying a resin composition that contains solder particles, a convection additive and a resin as main components onto the circuit board or the semiconductor chip; a positioning member for positioning the semiconductor chip by holding the porous sheet on the circuit board; and a heating member for melting the solder particles of the resin composition. According to this apparatus, the flip chip mounted body having excellent reliability can be manufactured at a low cost and high productivity.

Incidentally, in the present invention, a main component means 80 wt % or more, and preferably 90 wt % or more.

In the above description, a melting point of the solder particles preferably ranges between 100° C. and 300° C. inclusive.

Moreover, an average particle diameter of the solder particles preferably ranges from 1 μm to 50 μm.

Further, a temperature at which the solder resin paste is heated preferably is the melting point of the solder or more.

The solder resin paste includes a resin, solder particles and a convection additive that is boiled when the resin is heated. As the resin, a thermosetting resin (for example, an epoxy resin) is used, and as the solder particles, Pb-free solder particles are used. As the convection additive, a solvent (for example, an organic solvent) can be used, and examples thereof include isopropyl alcohol (boiling point: 82.4° C.), butyl acetate (boiling point: 125° C. to 126° C.), butyl carbitol (diethylene glycol monobutyl ether, boiling point: 201.9° C.), ethylene glycol (boiling point: 197.6° C.) and the like. The content of the convection additive in the resin is not limited particularly, and preferably ranges from 0.1 wt % to 20 wt %.

Moreover, the “convection” of the convection additive means convection as a form of a motion, and may be any form of motion that provides kinetic energy to the solder particles that are dispersed in the resin by the motion of the boiled convection additive in the resin, and promotes the transfer of the solder particles. Incidentally, as the convection additive, not only a convection additive that is boiled by itself and generates convection, but also a convection additive that generates gas ($H_2O$, $CO_2$, $N_2$ or the like) by the heating of the resin can be used. Examples thereof include a compound containing hydrated crystal materials, a compound that is decomposed by heat and a foaming agent.

Arbitrary solder particles can be selected to be used. Examples thereof listed in Table 1 can be used. Materials listed in Table 1 as examples may be used alone or in combination appropriately. Moreover, it is preferable to use a material whose melting point is lower than a curing temperature of the thermosetting resin as the solder particles, because the resin is heated and cured after the resin flows and is self-assembled, so that electrical connection and sealing by the resin can be achieved.

TABLE 1

| Composition of solder particle | Melting point (solidus) (° C.) |
|---|---|
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

A melting point of the solder particles preferably ranges from 100° C. to 300° C., and more preferably ranges from 139° C. to 240° C., as shown in Table 1. If the melting point is less than 100° C., a problem in durability tends to occur. If the melting point is more than 300° C., it becomes difficult to select the resin.

An average particle diameter of the solder particles preferably ranges from 1 μm to 30 μm, and more preferably ranges from 5 μm to 20 μm. When the average particle diameter is less than 1 μm, it becomes difficult to melt the solder particles due to the surface oxidation, and the formation of the electric connectors tends to take too much time. When the average particle diameter is more than 30 μm, it becomes difficult to obtain the electric connectors due to the sedimentation of the solder particles. Note here that the average particle diameter can be measured using a commercially available particle size distribution analyzer. For example, the average particle diameter can be measured using a laser diffraction particle size analyzer (LA920) available from HORIBA, Ltd., a laser diffraction particle size analyzer (SALD2100) available from Shimadzu Corporation, or the like.

Next, the resin will be described. Typical examples of the resin include: thermosetting resins such as epoxy resin, phenol resin, silicone resin, diallyl phthalate resin, furan resin, and melamine resin; thermoplastic resins such as polyester elastomer, fluororesin, polyimide resin, polyamide resin, and aramid resin; photocurable (ultraviolet curable) resins; and mixtures thereof in combination.

The mixing ratio by volume of the solder particles and the resin preferably is in the following range: conductive particles:resin=50 to 5:95 to 50, more preferably, solder particles:resin=40 to 10:90 to 60. It is preferable to use the solder particles and the resin after they have been mixed together homogenously. For example, 20 vol % of the solder particles and 80 vol % of the epoxy resin are mixed homogenously by a kneading machine, and the thus-obtained mixture is used. Note here that a paste in which the solder particles remain dispersed may be used, or the rein formed into a sheet form may be used.

Furthermore, in preferred examples of the present invention, lead-free solder alloy particles whose melting point ranges from 200° C. to 250° C. can be used as the solder particles, for example. When the resin is a thermosetting resin, it is preferable that the curing temperature of the resin is higher than the melting point of the solder. With this configuration, it is possible to cure the resin during the steps of forming electric connectors and forming metal bumps, thus allowing the operation process to be shortened.

According to the flip chip mounted body and the method for mounting the flip chip mounted body of the present invention, the mounting method that provides a reliable connection between the semiconductor chip and the circuit board can be achieved, and the flip chip mounted body that has improved weather resistance against humidity or the like for increasing the life span of the circuit board and has excellent reliability can be achieved. Further, since a connection state between the electrode terminal and the connection terminal can be uniform, increased yield and improved production efficiency can be achieved.

Figure 1B:
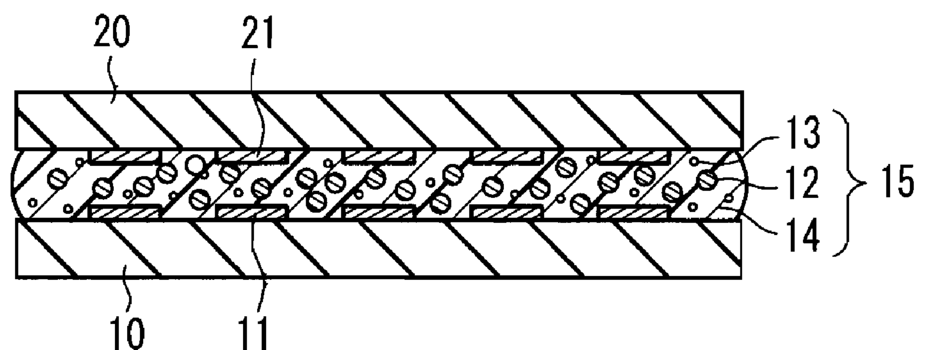
Figure 1C:
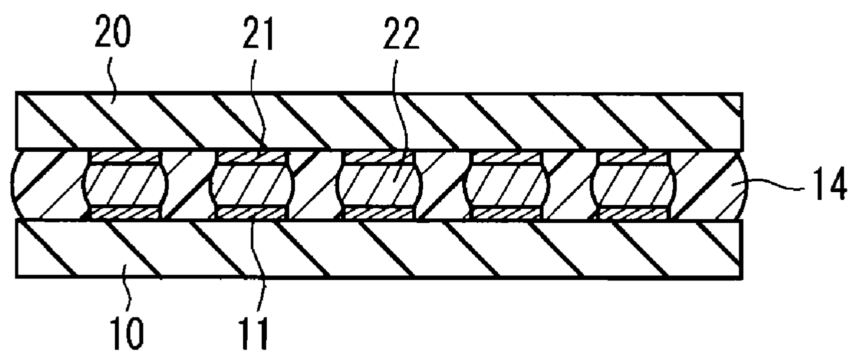

FIGS. 1A to 1C are views showing a mechanism of basic processes in one example of the present invention. Firstly, as shown in FIG. 1A, a resin composition 15 containing solder particles 12, a convection additive 13 and a resin 14 is supplied onto a circuit board 10 on which a plurality of connection terminals 11 are formed.

Next, as shown in FIG. 1B, the circuit board 10 and a semiconductor chip 20 are in touch with each other through the intervening the resin composition 15 that is supplied between the circuit board 10 and the semiconductor chip 20. At this time, the semiconductor chip 20 having a plurality of electrode terminals 21 is disposed opposing the circuit board 10 having the plurality of the connection terminals 11. And, in this state, the circuit board 10 is heated so as to melt the resin composition 15. Here, the circuit board 10 is heated at a temperature higher than a melting point of the solder particles 12. The melted solder particles 12 are bound to one another in the melted resin composition 15, and are self-assembled between the connection terminal 11 and the electrode terminal 21 that have high wettability so as to form a solder connector 22, as shown in FIG. 1C.

Then, the resin 14 is cured, so that the semiconductor chip 20 is fixed to the circuit board 10.

This method is characterized in that the resin composition 15 containing the solder particles 12 further contains a convection additive 13 that is boiled to a temperature at which the solder particles 12 are melted. That is, at the temperature at which the solder particles 12 are melted, the convection additive 13 contained in the resin composition 15 is boiled. Then, the convection of the boiled convection additive 13 occurs in the resin composition 14, thereby promoting the transfer of the melted solder particles 12 that float in the resin composition 14. As a result, the melted solder particles 12 that have been grown uniformly are self-assembled between the connection terminal 11 of the circuit board 10 and the electrode terminal 21 of the semiconductor chip 20 that have the high wettability, and the connection terminal 11 and the electrode terminal 21 are connected electrically via the uniform and fine solder connector 22.

That is, the above-described method is intended to add a means for transferring the melted solder particles forcefully by allowing the resin composition containing the solder particles further to contain the convection additive. Incidentally, the convection additive may be a solvent that is boiled or evaporated by heat, and hardly remains in the resin composition after the completion of the processes.

In the light of the similar technical standpoint, the present invention aims to achieve a new flip chip mounting method that is more precise and has higher reliability. And, by carrying out the present invention, a circuit board that is flip-chip-mounted can be manufactured at a significantly high yield.

Embodiment of the present invention will be described below in detail with reference to the drawings. It should be noted that the drawings are shown being expanded arbitrarily for easier recognition.

Embodiment 1

Figure 2:
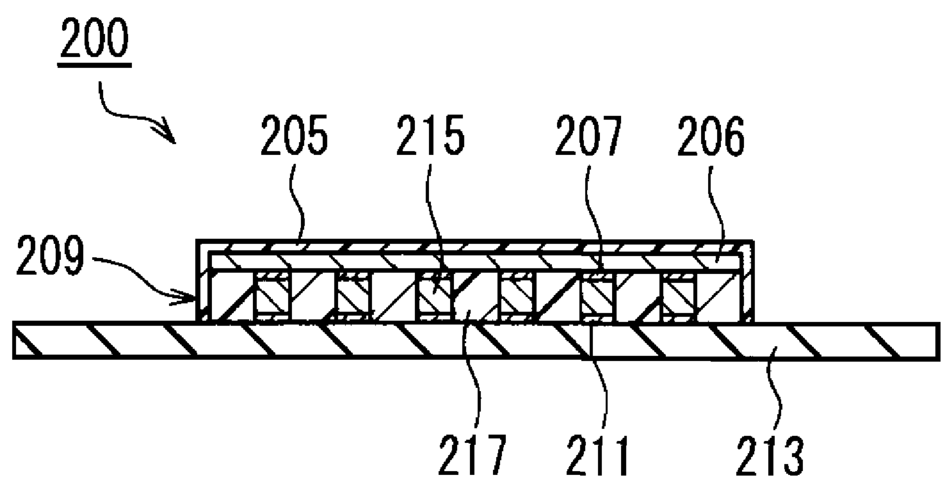
FIG. 2 is a cross-sectional view showing a flip chip mounted body according to Embodiment 1 of the present invention.

FIG. 2 is a cross-sectional view showing a flip chip mounted body according to Embodiment 1 of the present invention. In FIG. 2, a flip chip mounted body 200 according to Embodiment 1 of the present invention has a configuration where a plurality of connection terminals 211 formed on a circuit board 213 and a semiconductor chip 206 having a plurality of electrode terminals 207 that are disposed opposing the connection terminals 211 are connected electrically via a solder layer 215. Then, a porous sheet 205 that is provided on an opposite side of a formation surface of the electrode terminal 207 of the semiconductor chip 206 is folded to have a box shape 209 on the formation surface side of the electrode terminal 207 on an outer periphery of the semiconductor chip 206, and is formed so as to cover the semiconductor chip 206, whereby an end surface of the box shape 209 is in contact with the circuit board 213. Further, in a space formed by the circuit board 213 and the porous sheet 205 with the box-shape, the semiconductor chip 206 and the circuit board 213 are fixed by the solder layer 215 that connects the connection terminal 211 and the electrode terminal 207 electrically, and by a resin 217 that covers the surroundings thereof, thereby constituting the flip chip mounted body 200.

The flip chip mounted body and a flip chip mounting method according to Embodiment 1 of the present invention will be described below with reference to FIGS. 3A to 3E.

FIGS. 3A to 3E are cross-sectional process views explaining the flip chip mounted body and the flip chip mounting method according to Embodiment 1 of the present invention.

Figure 3A:
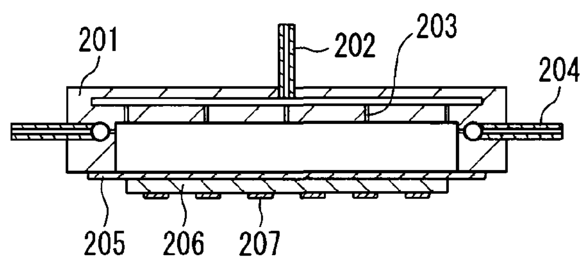
FIGS. 3A to 3E are cross-sectional process views showing the flip chip mounted body and a flip chip mounting method according to Embodiment 1 of the present invention.

Firstly, as shown in FIG. 3A, an upper mold 201 is provided with a suction pipe 202 that can achieve vacuum aspiration by exhausting air via an exhaust pipe 204 and a suction path 203 constituted of small holes. And, the porous sheet 205 is made of, for example, a thermosetting resin or a thermoplastic resin that is not dissolved into a solvent, which is a material having holes that allows gas to path through between a front side and a rear side. Example thereof include microporous PET (polyethylene terephthalate) and PTFE (polytetrafluoroethylene) that have air permeability. Incidentally, as a material of the porous sheet 205, not only a resin but also materials that have air permeability such as a nonwoven fabric and a foam metal may be used.

And, on the porous sheet 205, the semiconductor chip 206 that has a plurality of the electrode terminals 207 on a lower surface of the semiconductor chip 206 is adhered.

Figure 3B:
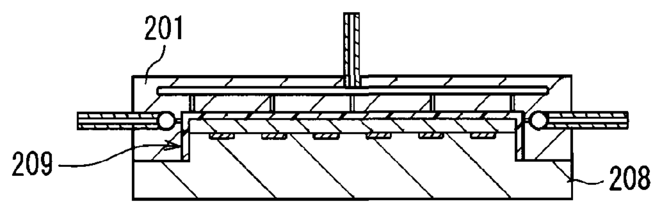

Next, as shown in FIG. 3B, the porous sheet 205 on which the semiconductor chip 206 is attached is disposed between the upper mold 201 and a lower mold 208, whereby only an end part of the porous sheet 205 is folded, for example, along a periphery (outer periphery) of the semiconductor chip 206 by applying a pressure, thereby deforming the porous sheet 205 into the box shape 209. At this time, it is preferable to heat the upper mold 201 and the lower mold 208 at a temperature appropriate for the deformation (for example, 120° C. in the case of PET), because the form of the porous sheet 205 can be deformed more easily.

Figure 3C:
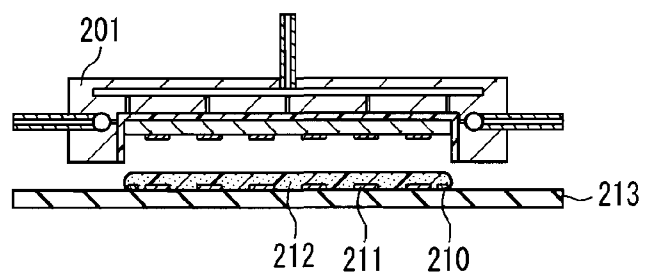

Next, as shown in FIG. 3C, the lower mold 208 is detached, and is replaced with a position of the circuit board 213 on which the upper mold 201 is to be mounted in a state of drawing the porous sheet 205 and the semiconductor chip 206. At this time, the connection terminal 211 formed on the surface of the circuit board 213 and the electrode terminal 207 of the semiconductor chip 206 are positioned by image recognition such as by a camera. Further, at a position where the semiconductor chip 206 is to be mounted at least on the circuit board 213, the resin composition 212 containing solder particles, a convection additive and a resin is applied by an applying member such as a dispenser. Moreover, around a part where the circuit board 213 does not make a short circuit with the connection terminal 211, for example, an electrode 210 that forms a dummy bump for preventing the scattering of the solder particles is provided. And, the electrode 210 for forming the dummy bump is provided on the circuit board 213 in a range surrounded by the box shape 209 of the porous sheet 205.

Figure 3D:
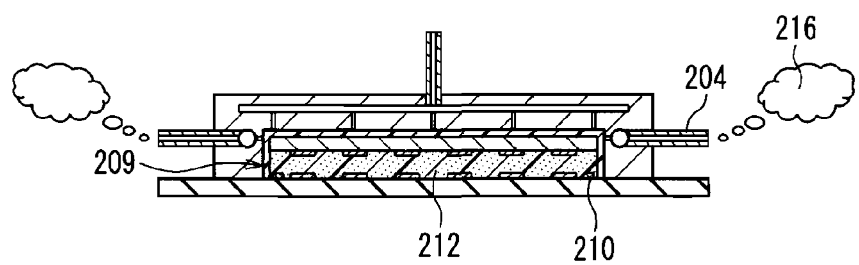

Next, as shown in FIG. 3D, the semiconductor chip 206 and the circuit board 213 are brought into contact with each other through the intervening the resin composition 212. Herein, the electrode terminal 207 of the semiconductor chip 206 and the connection terminal 211 of the circuit board 213 oppose each other so as to have a predetermined interval by the box shape 209 of the porous sheet 205. The predetermined interval means a spacing so that at least the electrode terminal of the semiconductor chip and the connection terminal of the circuit board are not in contact with each other, and the melted solder particles can intervene.

And, at least the circuit board 213 side is heated at a temperature ranging from 220° C. to 250° C., for example, at which the solder particles are melted by using a heating member, for example, a heater.

By this heating, the convection additive (not illustrated) in the resin composition 212 that is applied on the circuit board 213 is boiled or evaporated so as to be gasified, and the solder particles (not illustrated) are changed into melted solder particles. Then, in a process in which the gas passes through the holes in the porous sheet 205 that is folded to have the box shape 209 and goes out through the exhaust pipe 204 toward an outside, the melted solder particles in the resin composition 212 are transferred by the convection.

Further, the melted solder particles that have been transferred are self-assembled between the electrode terminal 207 of the semiconductor chip 206 and the connection terminal 211 of the circuit board 213 that are disposed opposing each other and have high wettability, and are grown.

A specific example will be given below. A mixture obtained by homogenously mixing 85 parts by volume of a bisphenol F type epoxy resin (Japan Epoxy Resins Co., Ltd., Epikote 806, including a hardening agent), 15 parts by volume of SnAgCu powder with a particle diameter ranging from 10 to 25 μm (average particle diameter: 17 μm), and 3 parts by weight of isopropyl alcohol as a convection additive was used as the solder resin paste. This solder resin paste was injected between the circuit board 213 and the surface of the semiconductor chip 206 using a dispenser. The temperature was raised from the room temperature (25° C.) to 250° C., and was maintained for 30 seconds. The solder resin paste then was cooled and the cross section thereof was observed, which revealed the state shown in FIG. 3E. As the porous sheet, a porous film of PTFE with a thickness of about 30 μm was used.

Figure 3E:
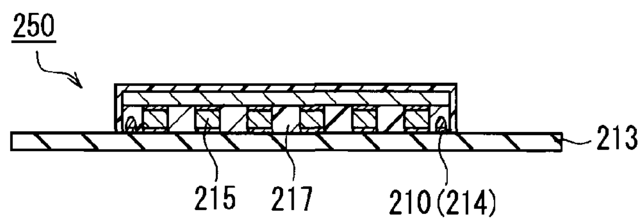

As shown in FIG. 3E, a solder layer 215 that electrically connects the electrode terminal 207 and the connection terminal 211 is formed, and the upper mold 201 is detached, so that the flip chip mounted body 250 is formed. Moreover, the melted solder particles are self-assembled and grown also on the electrode 210 for forming the dummy bump so as to form the dummy bump 214. By the formation of this dummy bump 214, the melted solder particles that are not used for forming the solder layer 215 are captured on the electrode 210 for forming the dummy bump, thereby being prevented from outflowing toward the outside.

Incidentally, the electrode 210 for forming the dummy bump is not necessarily provided in the case where the solder particles are not scattered and there occurs no problem even when the solder particles are scattered. The configuration thereof in the case of not providing the electrode 210 is the flip chip mounted body 200 shown in FIG. 2.

The resin 217 in the resin composition 212 can be squeezed out in small amount in the formation process of the dummy bump 214. Thus, after almost all of the gasified convection additive has passed through the exhaust pipe 204 toward the outside, the resin whose viscosity is decreased temporarily by the heating penetrates the holes of the porous sheet 205 by a capillary phenomenon so as to fill the holes. Thereby, the resin 217 that has penetrated the holes in the porous sheet 205 closes the holes of the porous sheet 205 being cured so as to prevent the intrusion of humidity and the like from the outside.

Moreover, the resin 217 after being cured fixes the semiconductor chip 206 and the circuit substrate 213, and the resin 217 squeezed out from the dummy bump 214 adheres the peripheral edge part of the porous sheet 205 that is folded to have the box shape 209 with the circuit board 213 so as to fix them.

According to Embodiment 1 of the present invention, the connection terminal of the circuit board and the electrode terminal of the semiconductor chip can be connected reliably by the self-assembled solder layer.

Moreover, the interval between the circuit board and the semiconductor chip can be maintained to be constant and uniform by the porous sheet that is deformed to have the box shape.

Moreover, since the scattering of the solder particles is suppressed by the electrode on which the dummy bump surrounding the semiconductor chip is formed, there is no influence on the outside by the scattering of the solder particles. As a result, the circuit board with excellent quality, which is not likely to generate a contact or a short circuit between the semiconductor chips, can be achieved.

Moreover, since the porous sheet finally has a configuration in which humidity and the like are not likely to pass through, the weather resistance of the semiconductor chip is improved, so that the effects of improving the reliability and enabling the long term use can be achieved.

Embodiment 2

FIGS. 4A to 4D are process views schematically explaining a flip chip mounted body and a flip chip mounting method according to Embodiment 2 of the present invention. It should be noted that the elements in FIGS. 4A to 4D that are the same as those in FIGS. 3 to E will be denoted by the same reference numerals, and the explanations thereof will be omitted.

Herein, a flip chip mounted body 300 in Embodiment 2 of the present invention adopts a mounting method that is different from that of the flip chip mounted body 250 of Embodiment 1, and has the same configuration except for this.

Figure 4A:
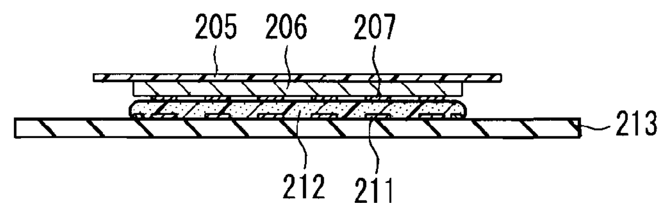
FIGS. 4A to 4D are cross-sectional process views schematically explaining a flip chip mounted body and a flip chip mounting method according to Embodiment 2 of the present invention.

Firstly, as shown in FIG. 4A, the connection terminal 211 on the circuit board 213 and the electrode terminal 207 of the semiconductor chip 206 are disposed opposing each other in advance. Then, between the semiconductor chip 206 and the circuit board 213, the resin composition 212 containing solder particles in a paste state, a convection additive and a resin as main components is applied by using, for example, a dispenser, and is intervened. Further, on the semiconductor chip 206, the porous sheet 205 is positioned with the semiconductor chip 206 and is adhered therewith.

Figure 4B:
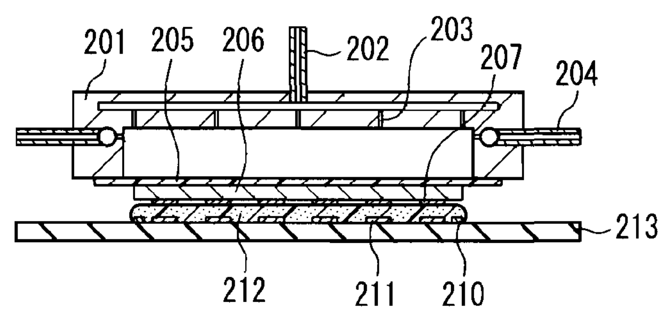

Next, as shown in FIG. 4B, a mold 220 is lifted down so as to draw the semiconductor chip 206 from an upper side. In this case, the mold 220 preferably is heated so as to facilitate the deformation of the porous sheet 205.

Figure 4C:
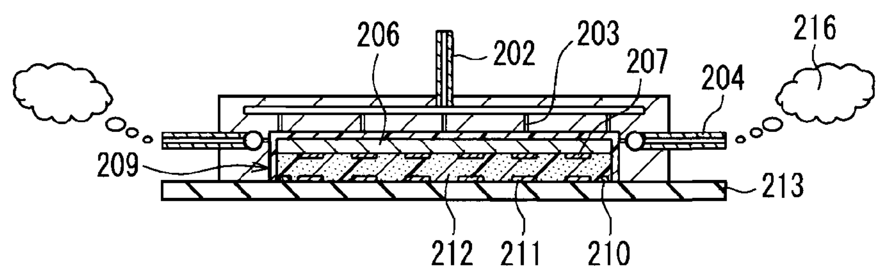

Next, as shown in FIG. 4C, the porous sheet 205 is deformed by the mold 220 into the box shape 209 along the outer periphery of the semiconductor chip 206. Herein, the porous sheet 205 preferably is deformed at a peripheral position that is slightly larger than the circumference of the semiconductor chip 206 so as not to damage the semiconductor chip 206.

Then, the porous sheet 205 and the semiconductor chip 206 are drawn into an inside of the mold 220 via the suction path 203 by a suction effect by the suction tube 202. Thereby, the porous sheet 205 is deformed to have the shape of the mold 220. Then, the mold 220 is in contact with the surface of the circuit board 213, so that the interval between the semiconductor chip 206 and the circuit board 213 is kept to be constant. Incidentally, this interval is a spacing so that at least the electrode terminal of the semiconductor chip and the connection terminal of the circuit board are not in contact with each other, and the melted solder powders can intervene.

Further, in the state of FIG. 4C, the mold 220 or the lower surface side of the circuit board 213 is heated by a heating means, for example, a heater (not illustrated) at a temperature ranging, for example, from 220° C. to 250° C., at which the solder particles are melted and the convection additive is boiled or evaporated so as to be changed into gas 216.

By this heating, the convection additive (not illustrated) in the resin composition 212 that is applied onto the circuit board 213 is boiled or evaporated so as to be changed into the gas 216, and the solder particles (not illustrated) are changed into the melted solder particles. Then, in a process in which the gas 216 passes through the holes of the porous sheet 205 that is folded to have the box shape 209 and flows out through the exhaust pipe 204 toward the outside, the melted solder particles in the resin composition 212 are transferred by the convection.

Further, the melted solder particles that have been transferred are self-assembled between the electrode terminal 207 of the semiconductor chip 206 and the connection terminal 211 of the circuit board 213 that are disposed opposing each other and have high wettability, and are grown.

Figure 4D:
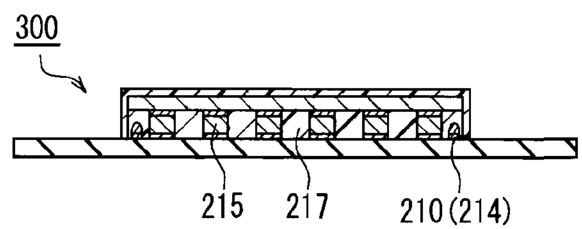

Thereby, as shown in FIG. 4D, the solder layer 215 that electrically connects the electrode terminal 207 and the connection terminal 211 is formed, and the mold 220 is detached, thereby manufacturing the flip chip mounted body 300. Reference numeral 217 denotes a resin.

Moreover, the melted solder particles are self-assembled and grown also on the electrode 210 for forming the dummy bump so as to form the dummy bump 214. By the formation of this dummy bump 214, the melted solder particles that have not been used for forming the solder layer 215 are captured on the electrode 210 for forming the dummy bump, and are prevented from flowing out toward the outside.

It should be noted that it is not necessary provide the electrode 210 for forming the dummy bump in the case where the solder particles are not scattered and there occurs no problem even when the solder particles are scattered.

As described above, according to Embodiment 2 of the present invention, the effect similar to that of Embodiment 1 can be achieved, and the lower mold is not necessary so as to enable the manufacture in the simplified facility.

Moreover, in the case where the porous sheet is a thermoplastic resin, a thermosetting resin, a nonwoven fabric or the like, the flip chip mounting can be achieved at a significantly low cost and with high productivity.

Embodiment 3

FIGS. 5A to 5D are Process Views Schematically Explaining a flip Chip mounted body and a flip chip mounting method according to Embodiment 3 of the present invention. It should be noted that the elements in FIGS. 5A to 5D that are the same as those in FIGS. 3A to 3E will be denoted by the same reference numerals, and the explanations thereof will be omitted.

Herein, a flip chip mounted body 400 in Embodiment 3 of the present invention is different from the flip chip mounted body 250 in Embodiment 1 in the point that the porous sheet 205 has a brim 401 and a method for mounting it, and other configurations except for these are common.

Figure 5A:
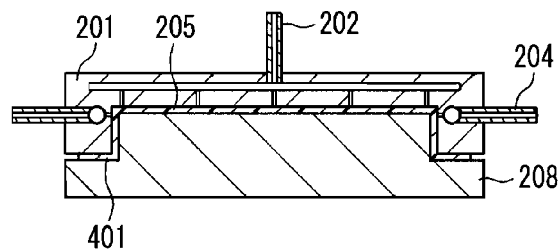
FIGS. 5A to 5D are cross-sectional process views schematically explaining a flip chip mounted body and a flip chip mounting method according to Embodiment 3 of the present invention.

Firstly, as shown in FIG. 5A, the porous sheet 205 is deformed to have a box shape that is provided with the brim 401 by the upper mold 201 and the lower mold 208 in advance.

The below description will provide an example where the brim 401 is provided by folding the edge of the porous sheet 205 having the box shape, but the present embodiment is not limited to this. In this case, since the semiconductor chip is not adhered to the porous sheet 205, the reliability of the semiconductor chip is not necessary to be considered for deforming the box shape, and conditions such as the application of a pressure and the heating are not limited. Thus, in the case where the porous sheet 205 is made of a material that is hardly deformed by heat such as a foam metal, Embodiment 3 of the present invention can be more effective. Further, by using a magnetic material such as nickel and iron for the foam metal, the generation of noises from the mounted semiconductor chip can be prevented, and a shield effect for preventing the noises from the outside can be obtained.

Figure 5B:
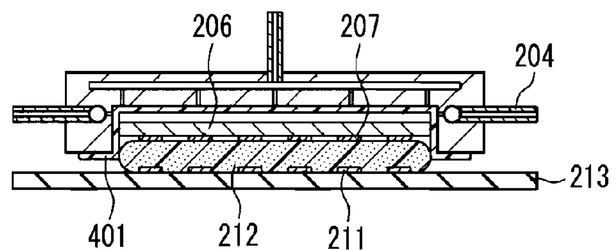

Next, as shown in FIG. 5B, in a state where the lower mold 208 is detached and the porous sheet 205 is drawn, the upper mold 201 is replaced with a position where the electrode terminal 207 of the semiconductor chip 206 and the connection terminal 211 of the circuit board 213 are disposed opposing each other. At this time, between the semiconductor chip 206 and the circuit board 213, the resin composition 212 that contains solder particles in a slurry state, a convection additive and a resin as main components is applied by using, for example, a dispenser, and is interposed.

Figure 5C:
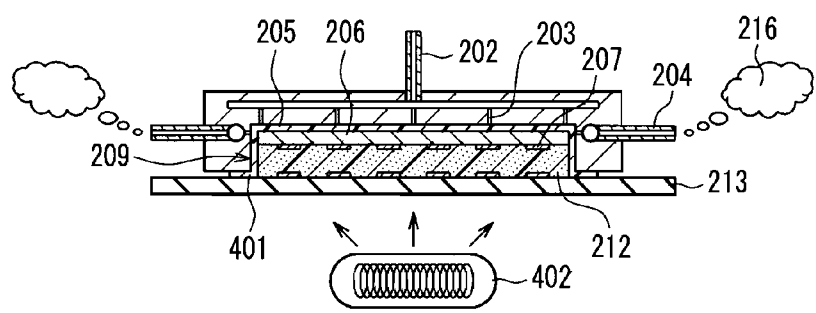

Moreover, when the porous sheet 205 with the box shape having the brim 401 is pressurized via the semiconductor chip 206, the resin composition 212 in the slurry state preferably is supplied slightly abundantly so as to be expanded to the outside slightly. As a result, as shown in FIG. 5C, the porous sheet 205 is pressurized via the semiconductor chip 206, so that the inside of the porous sheet 205 with the box shape having the brim 401 is filled with the resin composition 212 in the slurry state. Moreover, at this time, the semiconductor chip 206 is drawn by the porous sheet 205 via the holes of the porous sheet 205. Thus, the semiconductor chip 206 and the circuit board 213 oppose each other at a predetermined interval by the box shape 209 of the porous sheet 205 having the brim 401. Incidentally, the predetermined interval is at a spacing so that at least the electrode terminal of the semiconductor chip and the connection terminal of the circuit board are not in contact with each other and the melted solder particles can intervene.

Next, in a state shown in FIG. 5C, the upper mold 201 or the lower surface side of the circuit board 213 is heated by a heating means, for example, a heater 402 at a temperature ranging, for example, from 220° C. to 250° C., at which the solder particles are melted and the convection additive is boiled or evaporated so as to be changed into the gas 216.

According to this heating, the convection additive (not illustrated) in the resin composition 212 that is applied onto the circuit board 213 is boiled or evaporated so as to be changed into the gas 216, and the solder particles (not illustrated) are changed into the melted solder particles. Then, in the process in which the gas 216 passes through the holes in the porous sheet 205 that is folded to have the box shape having the brim 401 and goes out through the exhaust pipe 204 toward the outside, the melted solder particles in the resin composition 212 are transferred by the convection.

Figure 5D:
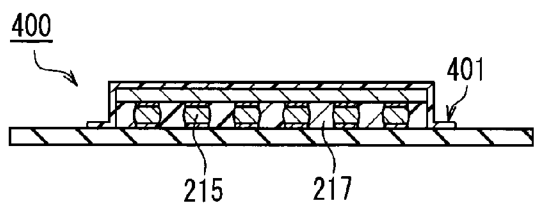

Further, the melted solder particles that have been transferred are self-assembled between the electrode terminal 207 of the semiconductor chip 206 and the connection terminal 211 of the circuit board 213 that are disposed opposing each other and have high wettability, and are grown. Thereby, as shown in FIG. 5D, the solder layer 215 that electrically connects the electrode terminal 207 and the connection terminal 211 is formed, and the upper mold 201 is detached, thereby manufacturing the flip chip mounted body 400 that is flip-chip-mounted. Reference numeral 217 denotes the resin.

Moreover, the melted solder particles are captured by the brim 401 of the porous sheet 205 having the box shape, and cannot be scattered toward the outside.

Further, after almost all of the gasified convection additive has passed through the exhaust pipe 204 toward the outside, the resin whose viscosity is decreased temporarily by the heating penetrates the holes of the porous sheet 205 by a capillary phenomenon so as to fill the holes. Thereby, the resin that has penetrated the holes in the porous sheet 205 closes the holes of the porous sheet 205 after the curing so as to prevent the intrusion of humidity and the like from the outside.

Moreover, the resin in the resin composition after the curing fixes the semiconductor chip 206 and the circuit board 213, and a part of the resin reaches a part of the brim 401 of the porous sheet 205 having the box shape, adheres the porous sheet 205 and the circuit board 213 and fixes them. That is, after the resin is cooled and cured completely, the semiconductor chip 206, the circuit board 213 and the porous sheet 205 having the box shape are fixed with one another completely by the function of the resin.

It should be noted that, in FIG. 5, the porous sheet having the box shape that is substantially the same as the circumference of the semiconductor chip was described, but the present embodiment is not limited to this. For example, similarly to Embodiment 1, the porous sheet may have a box shape that is larger than an outer shape of the semiconductor chip.

Moreover, in the case where a connection strength between the circuit board and an end surface of the box shape of the porous sheet is high, it is not particularly necessary to form the brim.

According to Embodiment 3 of the present invention, the electrode for forming the dummy bump that prevents the scattering of the solder particles is not used, but the outflow of the solder particles and the resin can be prevented by the brim that is formed around the porous sheet having the box shape. Further, since the connection area with the circuit board can be obtained due to the brim more than that in the case of not providing the brim, as the connection between the circuit board and the porous sheet becomes stronger, the reliability with respect to the deformation can be increased more.

Embodiment 4

FIGS. 6A to 6D are Process Views Schematically Explaining a flip chip mounted body and a flip chip mounting method according to Embodiment 4 of the present invention. It should be noted that the elements in FIGS. 6A to 6D that are the same as those in FIGS. 3A to 3E will be denoted by the same reference numerals, and the explanations thereof will be omitted.

Herein, a flip chip mounted body 500 in Embodiment 4 of the present invention is different from the flip chip mounted body 400 of Embodiment 3 in its mounting method, and the configurations except for this are the same.

Moreover, in Embodiment 4, the process for deforming the porous sheet 205 is the same as the process of FIG. 5A showing the process of Embodiment 3, and thus the explanation thereof will be omitted.

Figure 6A:
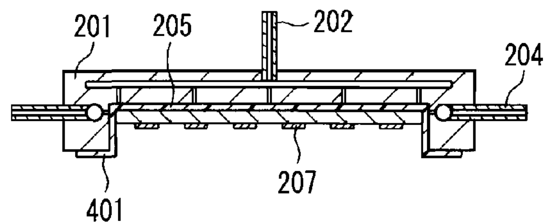
FIGS. 6A to 6D are cross-sectional process views schematically explaining a flip chip mounted body and a flip chip mounting method according to Embodiment 4 of the present invention.

Firstly, as shown in FIG. 6A, the semiconductor chip 206 is drawn by vacuum to an inside surface of the porous sheet 205 via the holes of the porous sheet 205 in advance.

Figure 6B:
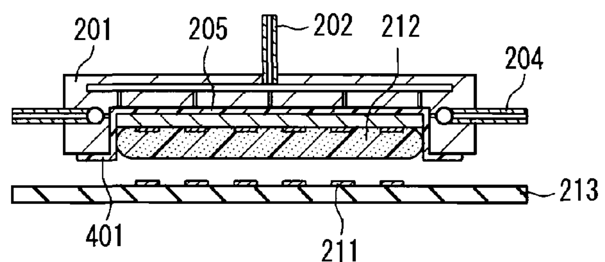

Next, as shown in FIG. 6B, the resin composition 212 that contains the solder particles in a paste state, a convection additive and a resin as main components is applied onto the lower surface of the semiconductor chip 206 by using an applying member, for example, a dispenser. Needless to say, the resin composition 212 may be applied onto the circuit board 213. Thereafter, the upper mold 201 is set down while positioning the connection terminal 211 of the circuit board 213 and the electrode terminal 207 of the semiconductor chip 206.

Figure 6C:
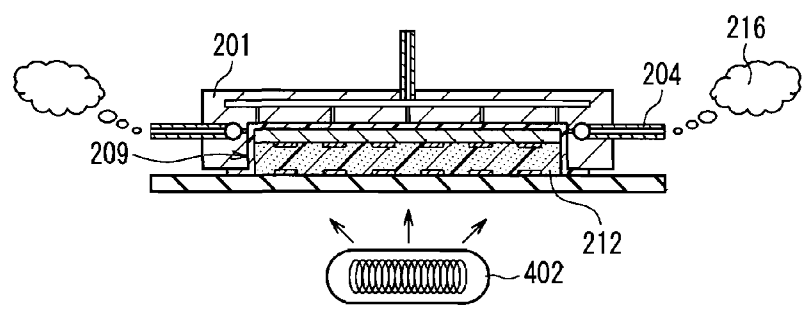

Next, as shown in FIG. 6C, the semiconductor chip 206 and the circuit board 213 are disposed in the porous sheet 205. At this time, the electrode terminal 207 of the semiconductor chip 206 and the connection terminal 211 of the circuit board 213 are positioned opposing each other at a predetermined interval. Incidentally, the predetermined interval means to be at a spacing so that at least the electrode terminal of the semiconductor chip and the connection terminal of the circuit board are not in contact with each other and the melted solder particles can intervene.

Then, in the state described above, the upper mold 201 or the lower surface side of the circuit board 213 is heated by a heating means, for example, the heater 402 at a temperature ranging, for example, from 220° C. to 250° C., at which the solder particles are melted and the convection additive is boiled or evaporated so as to be changed into the gas 216.

According to this heating, the convection additive (not illustrated) in the resin composition 212 that is applied onto the circuit board 213 is boiled or evaporated so as to be changed into the gas 216, and the solder particles (not illustrated) are changed into the melted solder particles. Then, in the process in which the gas 216 passes through the holes in the porous sheet 205 that is folded to have the box shape having the brim 401 and goes out through the exhaust pipe 204 toward the outside, the melted solder particles in the resin composition 212 are transferred by the convection.

Figure 6D:
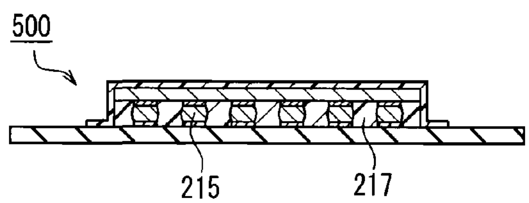

Further, the melted solder particles that have been transferred are self-assembled between the electrode terminal 207 of the semiconductor chip 206 and the connection terminal 211 of the circuit board 213 that are disposed opposing each other and have high wettability, and are grown. Thereby, as shown in FIG. 6D, the solder layer 215 that electrically connects the electrode terminal 207 and the connection terminal 211 is formed, and the upper mold 201 is detached, thereby manufacturing the flip chip mounted body 500 that is flip-chip-mounted. Reference numeral 217 denotes the resin.

As described above, according to Embodiment 4 of the present invention, the effect similar to those of the respective embodiments can be obtained, and the porous sheet 205 and the semiconductor chip 206 are transferred in combination, and the leakage of the air at the time of the drawing by vacuum is smaller than that of Embodiment 3, thereby achieving the stable transfer.

As described above, the present invention has been described by way of the respective embodiments, but these descriptions do not limit the present invention, and various modification are possible. For example, as the resin containing the solder particles and the convection additive, the thermosetting resin was exemplified, but, for example, photocurable resins having flowability at a temperature higher than the melting point of the solder particles and resins using them in combination also may be used, as long as the porous sheet may be transparent with respect to light.

Moreover, in the respective embodiments of the present invention, the example of using only one semiconductor chip was provided, but it is actually possible to dispose a plurality of the semiconductor chips on the circuit board at the same time so as to carry out the respective processes.

Moreover, in the respective embodiments of the present invention, the box shape of the porous sheet was described to be folded vertically, but the shape thereof is not limited to this. For example, it may be a tapered shape. Thereby, it is possible to enlarge the area of the holes of the porous sheet that allow the gas generated by the boiling or the like of the convection additive to pass through toward the outside, and thus the curing temperature, a curing time and the like can be adjusted easily.

Moreover, in the respective embodiments of the present invention, the example where the circuit board side is heated was provided, but a side of the mold for supporting the porous sheet and the semiconductor chip also may be heated, and further, both sides may be heated.

Moreover, in the respective embodiments of the present invention, as the resin in the resin composition, a resin that contains any of epoxy resin, unsaturated polyester resin, polybutadiene resin, polyimide resin, polyamide resin and cyanate resin as a main material also can be used.

Further, in the respective embodiments of the present invention, as the convection additive, decomposition type sodium hydrogencarbonate, ammonium metaborate, aluminum hydroxide, dawsonite, barium metaborate, butyl carbitol as a boiling-evaporation type, medium boilers and high boilers such as flux, isobutyl alcohol, xylene, isopentyl alcohol, butyl acetate, tetrachlorethylene, methyl isobutyl ketone, ethyl carbitol, butyl carbitol and ethylene glycol, and the like can be used.

INDUSTRIAL APPLICABILITY

The present invention can apply a narrow pitch to flip chip mounting of a proceeding next-generation semiconductor chip, and is useful in the fields that require flip chip mounting with excellent productivity and reliability.

The invention claimed is:

1. A flip chip mounting method for disposing a semiconductor chip having a plurality of electrode terminals so as oppose a circuit board having a plurality of connection terminals and connecting the connection terminal of the circuit board and the electrode terminal of the semiconductor chip electrically, the flip chip mounting method comprising:

deforming a porous sheet so as to have a box shape covering the semiconductor chip;

adhering the semiconductor chip to an inside bottom part of the porous sheet having a box shape;

applying a solder resin composition that contains solder particles, a convection additive and a resin as main components onto the circuit board or the semiconductor chip;

positioning so as to dispose the porous sheet on the circuit board;

heating the resin composition to a temperature at which the solder particles are melted so as to generate gas by boiling or decomposition of the convection additive; and connecting the connection terminal and the electrode terminal electrically by allowing the melted solder particles to flow in the resin composition so as to self-assemble and grow the solder particles before the gas is released, passes through the porous sheet and is scattered.

2. The flip chip mounting method according to claim 1, wherein the deforming of the porous sheet comprises heating.

3. The flip chip mounting method according to claim 1, wherein the porous sheet has a box shape covering the semiconductor chip in the deforming of the periphery of the porous sheet, and a peripheral edge of an opening of the porous sheet having the box shape is in contact with the circuit board so as to dispose the semiconductor chip and the circuit board at a predetermined interval.

4. The flip chip mounting method according to claim 1, wherein the porous sheet covers the semiconductor chip, and has a box shape having a brim whose peripheral edge protrudes near an opening.

5. The flip chip mounting method according to claim 1, wherein the porous sheet has a hole that connects a front side and a rear side.

6. The flip chip mounting method according to claim 1, wherein the porous sheet is made of at least one material that has air permeability selected from the group consisting of a thermoplastic resin, a thermosetting resin, a nonwoven fabric and a foam metal.

7. The flip chip mounting method according to claim 1, wherein the resin contained in the resin composition penetrates the porous sheet by the heating of the circuit board, closes the hole of the porous sheet and is cured after completion of the heating of the circuit board so as to reduce or inhibit moisture permeability.

8. The flip chip mounting method according to claim 1, wherein the part around the porous sheet that is in contact with the circuit board is contacted with the resin contained in the resin composition.

9. The flip chip mounting method according to claim 1, wherein the electrode is provided so as to surround the connection terminal of the circuit board.

10. The flip chip mounting method according to claim 1, wherein the electrode that is provided so as to surround the connection terminal of the circuit board is formed so as to be positioned inside the porous sheet that has a box shape, and a dummy bump is formed by the heating of the circuit board.

11. The flip chip mounting method according to claim 10, wherein the electrode on which the dummy bump is formed by the heating prevents passing of the solder particles in the resin composition applied between the semiconductor chips of the circuit board, and enables the passing of the resin.

* * * * *

UNITED STATES PATENT AND TRADEMARK OFFICE

CERTIFICATE OF CORRECTION

PATENT NO. : 8,071,425 B2
APPLICATION NO. : 12/764455
DATED : December 6, 2011
INVENTOR(S) : Nakatani et al.

It is certified that error appears in the above-identified patent and that said Letters Patent is hereby corrected as shown below:

Title Page, Column 2, (56) "OTHER PUBLICATIONS" Sakamoto reference, line 3: "vol. 30," should read --vol. 20,--.

Signed and Sealed this
Twenty-eighth Day of August, 2012

David J. Kappos
*Director of the United States Patent and Trademark Office*